US00RE35472E

United States Patent [19]

Frigerio et al.

[11] E Patent Number: Re. 35,472

[45] Reissued Date of Patent: Mar. 11, 1997

[54] HIGH SPEED ANALOG-TO-DIGITAL CONVERTER USING CELLS WITH BACK-TO-BACK CAPACITORS FOR BOTH ROUGH AND FINE APPROXIMATION

[75] Inventors: Giulio Frigerio, Cavenago Brianza; Alessandro Cremonesi, S. Angelo Lodigiano, both of Italy

[73] Assignee: SGS-Thomson Microelectronics, S.r.l., Milan, Italy

[21] Appl. No.: 192,104

[22] Filed: Feb. 4, 1994

Related U.S. Patent Documents

Reissue of:

[64] Patent No.: 5,086,299
Issued: Feb. 4, 1992
Appl. No.: 520,724
Filed: May 9, 1990

[30] Foreign Application Priority Data

May 17, 1989 [IT] Italy ..... 20537 A/89

[51] Int. Cl.[6] ..... H03M 1/14

[52] U.S. Cl. ..... 341/156; 341/172

[58] Field of Search ..... 341/156, 157, 341/161, 163, 172

[56] References Cited

U.S. PATENT DOCUMENTS

| | | | |
|---|---|---|---|
| 4,051,469 | 9/1977 | Ninomiya | 341/110 |
| 4,072,939 | 2/1978 | Heller et al. . | |
| 4,325,055 | 4/1982 | Colardelle et al. . | |
| 4,348,658 | 9/1982 | Carter . | |
| 4,381,496 | 4/1983 | Carter . | |
| 4,451,821 | 5/1984 | Domogalla . | |
| 4,458,237 | 7/1984 | Domogalla . | |
| 4,608,555 | 8/1986 | Hoeft . | |
| 4,639,715 | 1/1987 | Doluca | 341/120 |
| 4,641,130 | 2/1987 | Mastroianni . | |
| 4,760,376 | 7/1988 | Kobayashi et al. | 341/172 |
| 4,763,106 | 8/1988 | Gulczynski . | |
| 4,763,107 | 8/1988 | Koen et al. . | |
| 4,764,753 | 8/1988 | Yukawa | 341/172 |
| 4,768,016 | 8/1988 | Chu et al. . | |
| 4,799,042 | 1/1989 | Confalonieri et al. . | |
| 4,851,846 | 7/1989 | Haulin | 341/172 |
| 4,857,931 | 8/1989 | Gulczynski . | |
| 4,875,048 | 10/1989 | Shimizu et al. . | |
| 4,890,107 | 12/1989 | Pearce | 341/156 |
| 4,894,657 | 1/1990 | Hwang et al. . | |
| 4,903,026 | 2/1990 | Tiemann et al. . | |
| 4,918,449 | 4/1990 | Chin | 341/156 |
| 4,928,103 | 5/1990 | Lane . | |
| 4,933,777 | 6/1990 | Hsieh et al. . | |
| 4,973,974 | 11/1990 | Suzuki | 341/118 |
| 4,973,976 | 11/1990 | Lee et al. | 341/141 |
| 4,982,194 | 1/1991 | Bacrania et al. . | |
| 4,989,002 | 1/1991 | Tan | 341/120 |
| 4,994,806 | 2/1991 | Yun-Tae . | |
| 5,014,055 | 5/1991 | Dingwall et al. | 341/159 |
| 5,151,700 | 9/1992 | Matsuzawa et al. | 341/156 |
| 5,247,301 | 9/1993 | Yahagi et al. | 341/156 |
| 5,258,761 | 11/1993 | Fotouhi et al. . | |
| 5,276,446 | 1/1994 | Sellars . | |

*Primary Examiner*—Marc S. Hoff
*Attorney, Agent, or Firm*—Betty Formby; Robert Groover

[57] ABSTRACT

A high conversion speed analog-to-digital converter is constituted by a plurality of comparison cells which in successive steps determine first the four most significant bits of the analog-to-digital conversion and then the least significant bits of the same, having first accomplished the reconversion of the four most significant bits to analog and their subsequent subtraction from the input signal.

15 Claims, 3 Drawing Sheets

HIGH SPEED ANALOG-TO-DIGITAL CONVERTER USING CELLS WITH BACK-TO-BACK CAPACITORS FOR BOTH ROUGH AND FINE APPROXIMATION

Matter enclosed in heavy brackets [ ] appears in the original patent but forms no part of this reissue specification; matter printed in italics indicates the additions made by reissue.

[DESCRIPTION]

*BACKGROUND AND SUMMARY OF THE INVENTION*

The present invention relates to a high speed analog-to-digital converter *and to a method for analog-to-digital conversion.*

Recent developments in the field of digital [techniques for the] *signal* processing [of signals] have increased interest [for] *in* high speed conversion.

In particular, the processing of signals in the video band creates the need of converters with a [band width] *bandwidth of* 10–50 Mhz and dynamic range [field] *range* of 8 bits.

An integrated approach for a digitization system requires the implementation, inside the conversion device itself, of several preprocessing functions.

In [such sector] *this art,* the use is known of flash (or instantaneous) converters having one or two steps. In particular, a single-step flash converter allows the use of conversion speeds of 120 Ms/sec (Megasamples per second) with bipolar technology and of 20 Ms/sec with CMOS technology. This approach does, however, have some drawbacks in terms of dissipated power, silicon area, *and* high capacitative load at input.

Such drawbacks are overcome in part by using flash converters having two conversion steps. In this case the conversion operation provides for a first step of rough conversion of the sampled input signal, whereby there are obtained the four most significant bits of the signal at output, and a second step which receives at input a signal equal to the difference between the sampled input signal and the output signal of the first conversion step, reconverted to analog, and [operates] *performs* a fine conversion completing the digital output signal with the four least significant bits.

The use of such two-step conversion devices unfortunately requires conversion times which are longer with respect to the use of single-step converters. It is in fact necessary to execute two successive flash conversions, [reconvert to analog] *including reconverting* the result of the first conversion operation *to analog* and [execute] *executing* a subtraction before the second fine conversion step.

The object of the present invention is thus to accomplish an analog-to-digital converter with a very high conversion speed [,] (*e.g.* around 50 Ms/sec in [the] CMOS technology), which has low input capacitance, low power dissipation, and [optimization] *optimal use* of [the] silicon area [used].

According to *an illustrated embodiment of* the invention, such object is accomplished by means of a converter, characterized in that it comprises a plurality of comparison cells which in successive steps determine the four most significant bits of the conversion and then the four least significant bits after the more significant bits have been reconverted to analog and [their subsequent subtraction] *then subtracted* from the input signal.

In particular, each of said comparison cells is constituted by a comparator with the input connected to an intermediate branch point between two condensers in series, *the first* one of which is supplied in a first step with an input signal, in a second step with a first reference voltage different for each cell, and in a third step with a selected reference voltage equal to that of said first reference voltages which approximates said input signal [downwards] *from below* with the highest accuracy, [and by a ] *with the* second condenser [which is] *being* grounded during said first and second steps, [while] *and connected,* during the third step [it is connected] , to one [respective] of a plurality of second reference voltages *which are* submultiples of said first reference voltage *(e.g. Vr'=Vr/16).*

In this way the result is obtained that a single group of comparators accomplishes both analog-to-digital conversion operations, *as well as* the operation of intermediate digital-to-analog reconversion of the output signal from the first step of analog-to-digital conversion and [that] *the operation* of subtraction of [said signal] *the* reconverted [to] analog *signal* from the input signal, which in normal two-step flash converters are accomplished by two groups of comparators with a digital-to-analog converter and subtractor connected in between. There follow [favourable] *favorable* results especially in terms of the speed of conversion, of the use of the silicon area and of power dissipation.

These and other features of the present invention shall be made evident by the following detailed description of an embodiment illustrated as an example in the enclosed [drawing] *drawings.*

*DESCRIPTION OF THE PREFERRED EMBODIMENTS*

*An embodiment of the invention will now be described. It will be understood that implicit in the description of the converter is a method for analog-to-digital conversion.*

Figure 1:
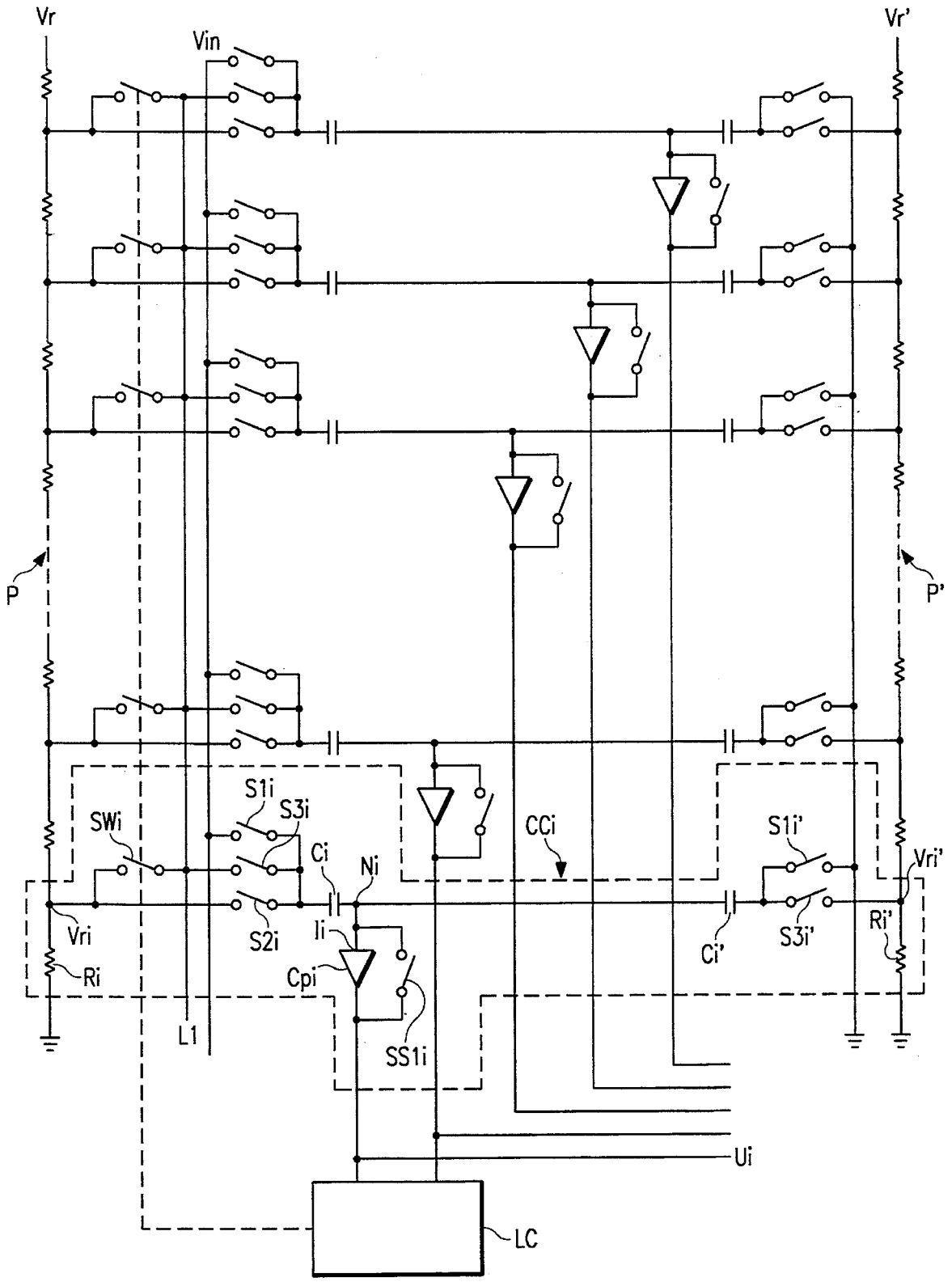
*FIG. 1* is a schematic diagram of the preferred embodiment of the present invention.

In detail, *as shown in FIG. 1,* the converter comprises a plurality of comparison cells *CCi,* in particular 15 in the case comparison is required to be executed in the 8-bit range. The generic comparison cell CCi comprises a comparator Cpi, of the type with one input only and with a digital output whose value depends on the variations of the input voltage, whose input is connected to an intermediate branch point Ni between two series condensers Ci and Ci', respectively.

The condenser Ci is in turn connected, on one side, to the branch point Ni and on the other side it communicates with a parallel of three different switches S1i, S2i, S3i, respectively, which are closed in temporal succession. In particular the switch S1i connects condenser Ci to an input voltage [Vi] *Vin,* the switch S2i connects the condenser Ci to a reference voltage Vri forming part of a voltage divider P constituted by a series of resistances Ri, in the specific case 16, of equal value connected between a terminal supplying a voltage Vr and ground, and switch S3i connects condenser Ci to a

[supply] *rough-approximation* line L1 which, by means of switch SWi, is connected to [that] *the one voltage Vrx,* among the different reference voltages Vri, which is in turn selected by a coding logic LC sensitive to the outputs of comparators Cpi as that which approximates the input voltage [Vi] *Vin* [downwards] *from below* with the highest accuracy.

Condenser Ci' is in turn connected, on one side, to the branch point Ni, and on the other side communicates with a parallel *combination* of two switches, S1i', S3i', respectively, of which S1i' grounds said condenser C1 and S3i' connects said condenser Ci' to a reference voltage Vri' forming part of a voltage divider P' constituted by a series of resistances Ri', in the specific case 16, of equal value connected between a terminal supplying a voltage Vr', where Vr'=Vr/16, and ground.

The input Ii of each comparator is also connected to the respective output Ui by means of a switch SS1i.

Due to the described structure the analog-to-digital converter operates as follows.

Figure 2A:
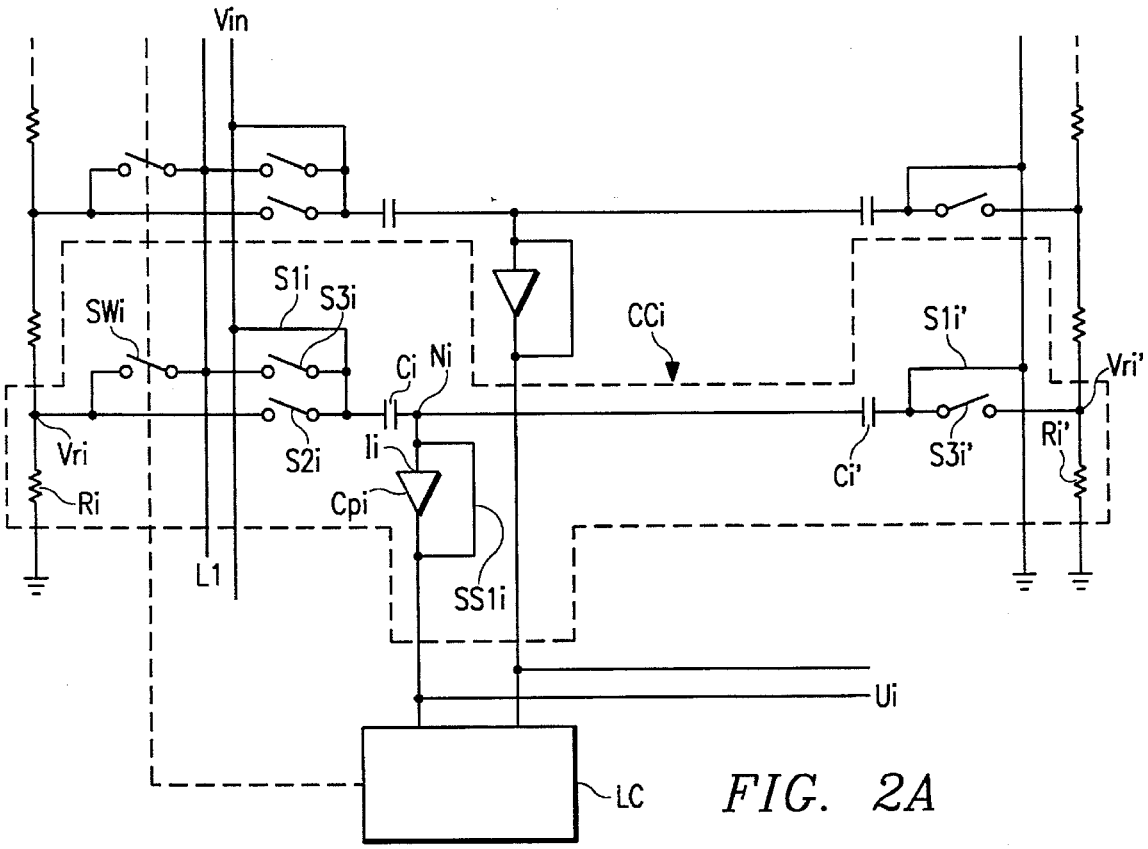
*FIG. 2A shows a portion of the circuit of FIG. 1 at a first point in time.

During a first step, *as shown in FIG. 2A,* switches S1i are closed and the value of the input voltage [Vi] *Vin* is [.] memorized in condensers Ci. Switches SS1i also are closed to allow automatic cancellation of the offset at the terminals of comparator Cpi. During this step, condensers Ci' are grounded through switches S1i', closed simultaneously with switches S1i *and SS1i.*

Figure 2B:
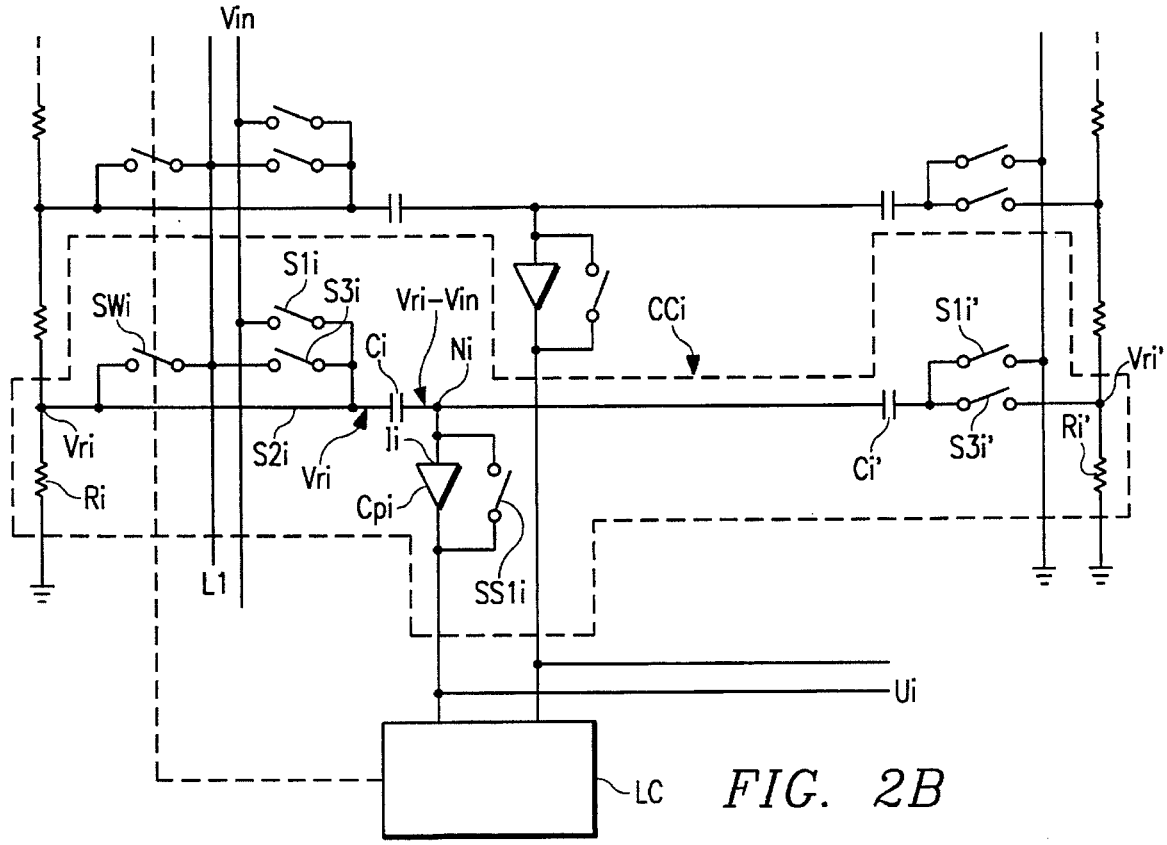
FIG. 2B shows the same circuit at a second point in time.

During a second step, *as shown in FIG. 2B,* switches S1i, S1i', and SS1i are open and switches S2i are closed, so that the left-hand [armature] *side* of the generic condenser Ci is brought to a respective reference voltage Vri. As a consequence, while condenser Ci still memorizes the input voltage [Vi] *Vin* , the voltage at the branch point Ni changes to a value [(Vr-Vi)] *(Vri-Vin)* which according to its [the] *its* sign (+or −) [translates] *is translated* to a logic level 0 or 1 on the generic output [Vi] *Ui* of comparator Cpi. There is thus [operated] *performed* a rough conversion of the input signal [obtaining] *Vin to obtain (in this example)* the 4 most significant bits of the digitalized signal [Vi].

Figure 2C:
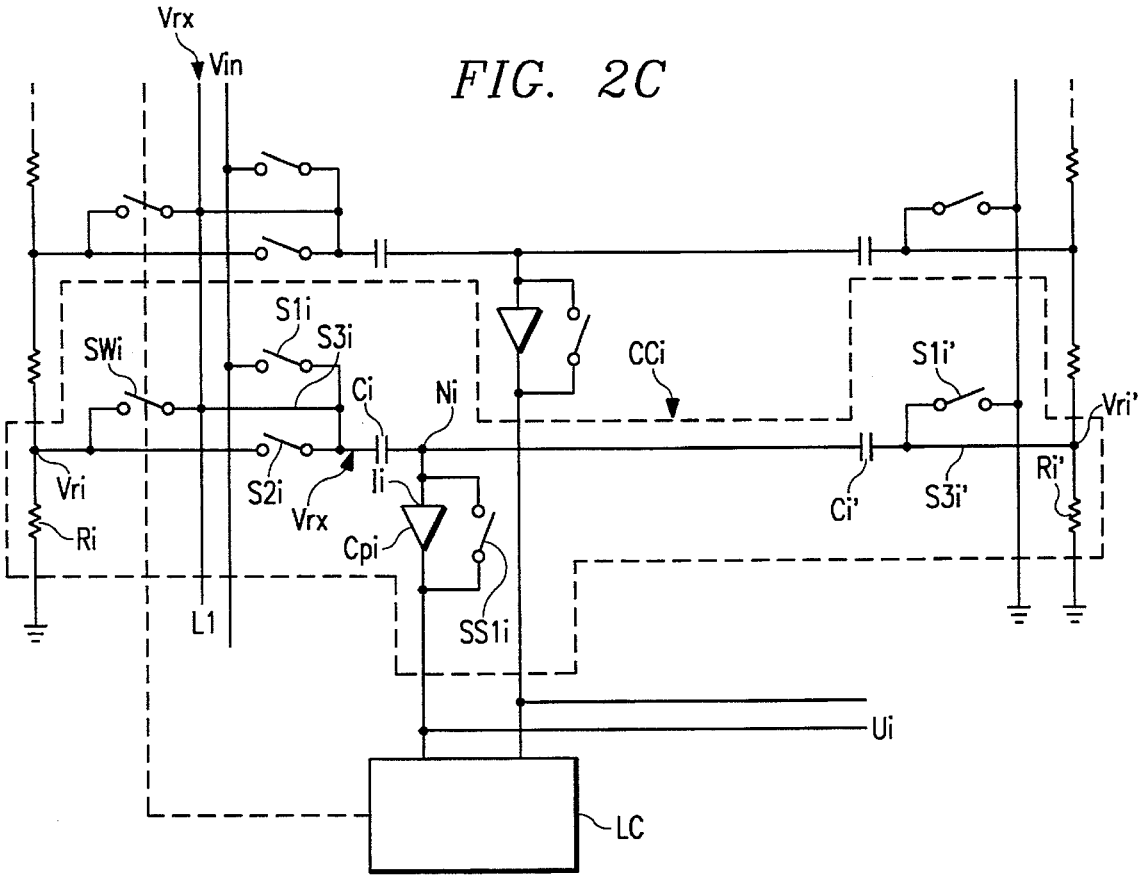
FIG. 2C shows the same circuit at a third point in time.*

During a third step [with] , *as shown in FIG. 2C,* switches S2i *are* returned [in] *to* open condition, *and* the coding logic LC, having detected the logic levels at the outputs of comparators Cpi, commands the closing of a selected switch SWi corresponding to the one *reference voltage Vrx, of all the* reference voltage*s* Vri, which best approximates the value of the four most significant bits of the input voltage [Vi downwards] *Vin from below,* thereby carrying out a reconversion of [said] *the* four most significant bits into a corresponding analog signal. Switches S3i and S3i' are then closed to connect *all of* the condensers Ci to the selected reference voltage ([Vrix]) *(Vrx)*, and *to connect the* condensers Ci' to respective reference voltage*s* Vri'. As a consequence, the branch point Ni moves to a voltage [Vi-Vrix] *Vin-Vrx,* thereby subtracting a voltage corresponding to the analog conversion of the four most significant bits of the digital output signal from the input voltage [Vi] *Vin.* According to whether [Vin-Vrix] *Vin-Vrx* [;] is lower or higher than the reference voltage Vri', the voltage at [the] *each* branch point Ni translates to a logic level 0 or 1 on the generic output Ui, thus resulting in [to] a ["and delete and allows the operation"; and allows the operation] fine conversion *operation* giving the 4 least significant bits of the input signal [Vi] *Vin.*

We claim:

1. [High] *A high* speed analog-to-digital converter, [characterized in that it comprises] *comprising;* a plurality of comparison cells which in successive steps determine the [four] most significant bits of the conversion and then,[the four least significant bits] after the more significant bits have been reconverted to analog and [their subsequent subtraction] *subtracted* from the input signal, *the least significant bits;*

[where] *wherein* each [of] said comparison [cells is constituted by] *cell comprises* a comparator [with] *having an* input connected to an intermediate branch point between [two] *first and second* condensers in series,

[one of which is ] *said first condenser being* supplied in a first step with an input signal, in a second step with a first reference voltage different for each cell, and in a third step with a selected reference voltage equal to [that] *the one* of said first reference voltages which approximates said input signal [downward] *from below* with the highest accuracy, [and by a]

*said second* condenser [which is] *being* grounded during said first and second step*s* , *and connected, during said* [while in the] third step, [it is connected] to *a respective* one [respective] of a plurality of second reference voltages *which are* submultiples of said first reference voltage.

2. [Converter] *A converter* according to [Claim] *claim* 1, further comprising [a] decoding logic which detects the value of the outputs of said comparators during said second step,and *accordingly* determines during said third step the choice of said selected reference voltage.

*3. The converter of claim 1, wherein said comparator is a single-input comparator.*

*4. The converter of claim 1, further comprising a shorting switch connected to short together an input with an output of said comparator during said first step.*

*5. The converter of claim 1, comprising 15 of said cells.*

*6. An integrated data conversion circuit, comprising:*

*a plurality of comparison cells, each including*

*first and second capacitors each having a respective first terminal connected to a common node.*

*a thresholding logic circuit connected to provide a digital output corresonding to the analog voltage of said common node*

*a first initializing switch connected to selectably connect a second terminal of said first capacitor to an analog input voltage, and a second initializing switch connected to selectably connect a second terminal of said second capacitor to a constant voltage, a reference-connecting switch connected to selectably connect said second terminal of said first capacitor to a particular respective corresponding rough-approximation reference voltage, and a first fine-approximation switch connected to selectably connect said second terminal of said first capacitor to a common rough-approximation line, and a second fine-approximation switch connected to selectably connect said second terminal of said second capacitor to a particular respective corresponding fine-approximation reference voltage which is smaller in magnitude than said particular respective corresponding rough-approximation reference voltage; and*

*control logic connected to receive the outputs of said thresholding logic circuits, and connected to activate said initializing switches in a first phase, said reference-connecting switch in a second phase, and said fine-approximation switches in a third phase, and, during said second phase, to connect, to said rough-approximation line, one of said rough-approximation reference voltages which is selected in dependence on the outputs of said thresholding logic circuits after said first phase;*

*whereby the outputs of said thresholding logic circuits provide a two-stage digital output corresponding to said analog input signal.*

*7. The integrated circuit of claim 6, wherein said thresholding logic circuit is a single-input comparator.*

*8. The integrated circuit of claim 6, further comprising an additional respective switch between each said rough-approximation reference voltage and said rough-approximation line, and wherein said control logic is connected to activate a selected one of said additional switches during said second phase.*

*9. The integrated circuit of claim 6, further comprising a first resistor ladder which supplies said rough-approximation reference voltages from multiple nodes thereof, and a second resistor ladder which supplies said fine-approximation reference voltages from multiple nodes thereof.*

*10. The integrated circuit of claim 6, comprising exactly 15 of said comparison cells.*

*11. A method for analog-to-digital data conversion, comprising:*

*providing a plurality of comparison cells, each including first and second capacitors each having a respective first terminal connected to a common node, and a thresholding logic circuit connected to provide a digital output dependent on the analog voltage of said common node,*

*during a first phase, connecting an analog input voltage to a second terminal of each said first capacitor, and connecting a second terminal of each said second capacitor to ground;*

*during a second phase, connecting a different respective one of a first set of reference voltages to said second terminal of each said first capacitor;*

*selecting a rough-approximation voltage in dependence on the outputs of said thresholding logic at the end of said second phase; and*

*during a third phase, connecting said rough-approximation voltage to said second terminals of all of said first capacitors, and connecting a different respective one of a second set of reference voltages to said second terminal of each said second capacitor; and*

*outputting bits corresponding to said outputs of said thresholding logic at the end of said second phase as more significant bits, and outputting bits corresponding to said outputs of said thresholding logic at the end of said third phase as less significant bits, to provide a digital value corresponding to said analog input value.*

*12. The method of claim 11, wherein, during said second phase, said second set of reference voltages provides four bits of additional resolution with respect to said first reference voltages.*

*13. The method of claim 11, wherein said first set of reference voltages is provided by a first resistor ladder, and said second set of reference voltages is provided by a second resistor ladder.*

*14. The method of claim 11, wherein said selecting step is performed by control logic which is connected to receive the outputs of each said thresholding logic circuit.*

*15. The method of claim 11, wherein said thresholding logic circuit is a single-input comparator.*

* * * * *